United States Patent [19]
Ebel et al.

[11] Patent Number: 5,841,724
[45] Date of Patent: Nov. 24, 1998

[54] VOLTAGE SOURCE AND MEMORY-VOLTAGE SWITCH IN A MEMORY CHIP

[75] Inventors: Mark S. Ebel, Los Altos; Robert Shen, Fremont, both of Calif.

[73] Assignee: Enable Semiconductor, Inc., Milpitas, Calif.

[21] Appl. No.: 873,445

[22] Filed: Jun. 12, 1997

[51] Int. Cl.⁶ ............................................. G11C 7/00
[52] U.S. Cl. .................. 365/226; 365/189.07; 327/545; 327/538
[58] Field of Search ............................ 365/226, 210, 365/189.07; 327/545, 538, 332

[56] References Cited

U.S. PATENT DOCUMENTS

| | | | |
|---|---|---|---|
| 4,617,473 | 10/1986 | Bingham | 307/66 |
| 4,713,555 | 12/1987 | Lee | 307/66 |
| 5,177,371 | 1/1993 | Faulk | 307/66 |
| 5,280,455 | 1/1994 | Kanaishi | 365/229 |
| 5,570,061 | 10/1996 | Shimoda | 327/545 |
| 5,612,920 | 3/1997 | Tomishima | 365/226 |
| 5,615,162 | 3/1997 | Houston | 365/226 |
| 5,659,571 | 8/1997 | Arimoto et al. | 365/226 |
| 5,663,918 | 9/1997 | Javanifard et al. | 365/226 |
| 5,701,272 | 12/1997 | Brennan | 365/230.06 |

OTHER PUBLICATIONS

ES62B256–45 Preliminary Data Sheet, Enable Semiconductor, Inc., 1740 Technology Drive, Suite 110, San Jose, CA 95110, Sep. 1996, pp. 1–9.

Primary Examiner—Son T. Dinh
Attorney, Agent, or Firm—Carr & Ferrell LLP

[57] ABSTRACT

A circuit for connecting a memory cell matrix to voltage sources includes a voltage sensor responsive to the voltage levels of a first voltage source and of a second voltage source by producing a sense signal, and a voltage source coupler connected between the memory cell matrix and the voltage sensor. When the first voltage source voltage level is greater than a predetermined threshold voltage level, the sense signal causes the voltage source coupler to drive the first voltage source voltage level into the memory cell matrix. When the first voltage source voltage level falls to the threshold voltage level, the sense signal also causes the voltage source coupler to drive the second voltage source voltage level into the memory cell matrix to sustain memory cell data.

44 Claims, 13 Drawing Sheets

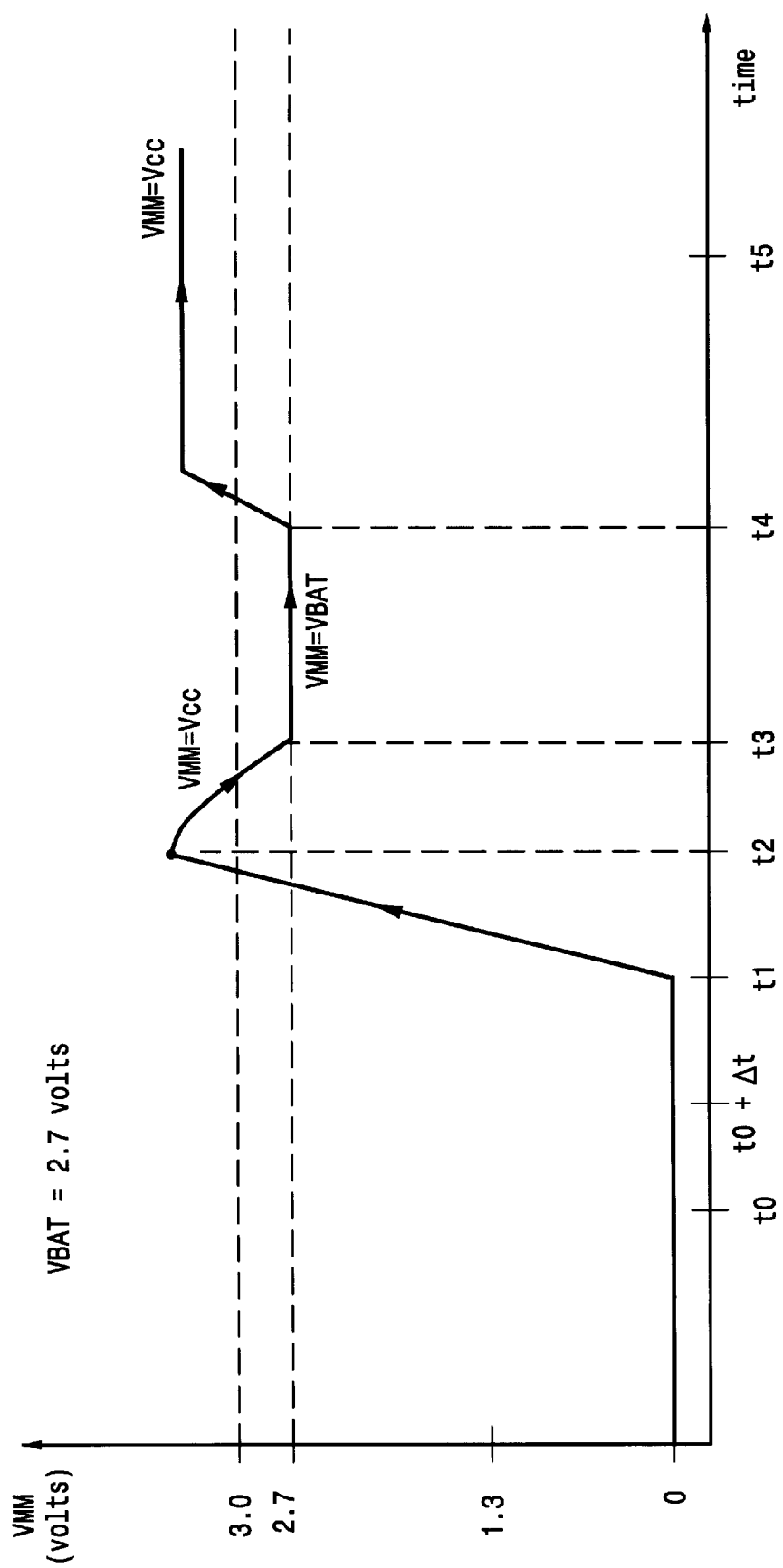

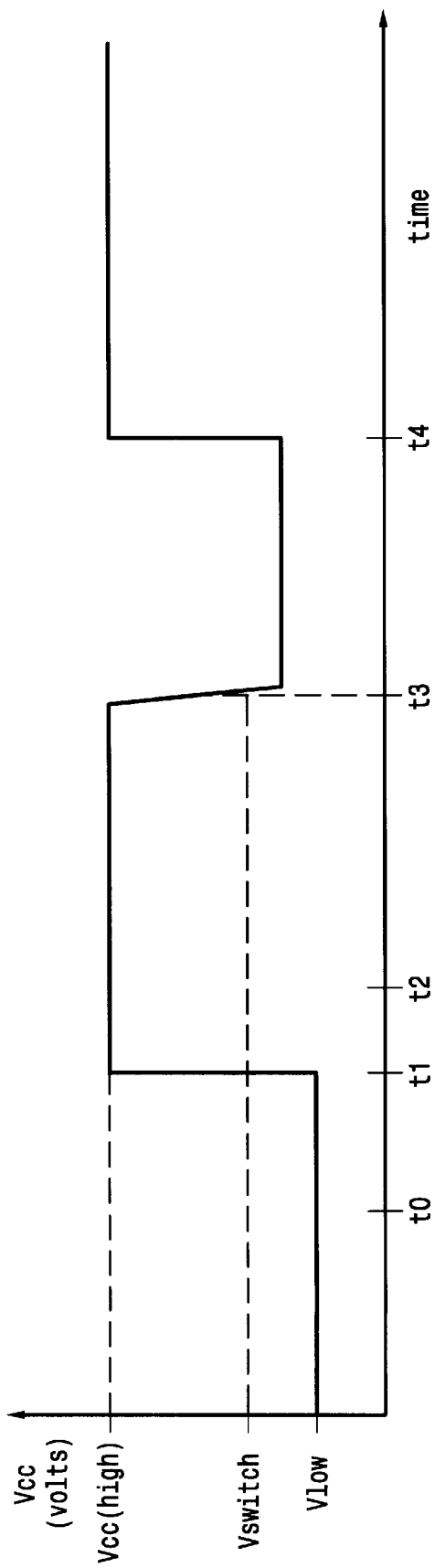

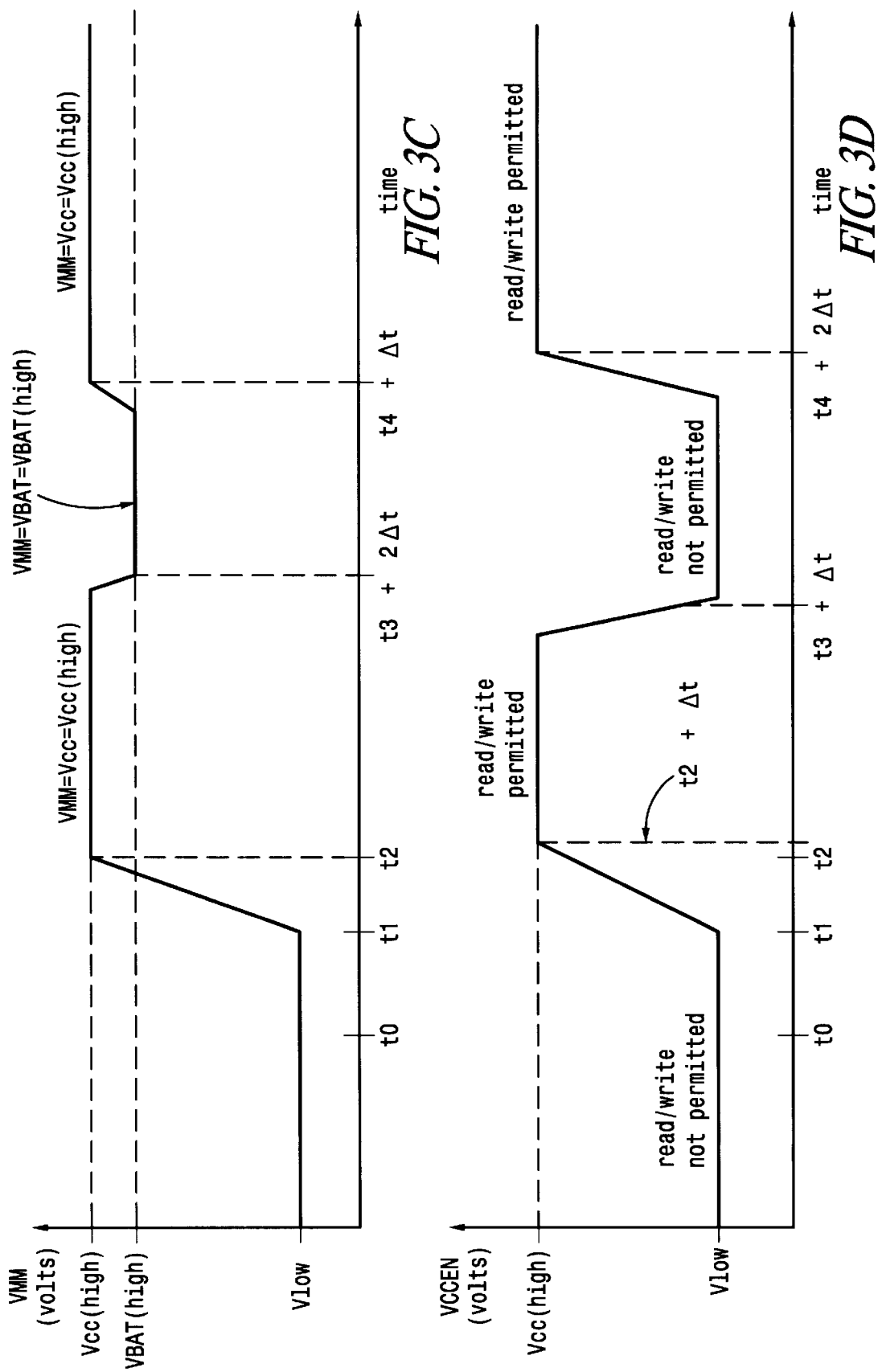

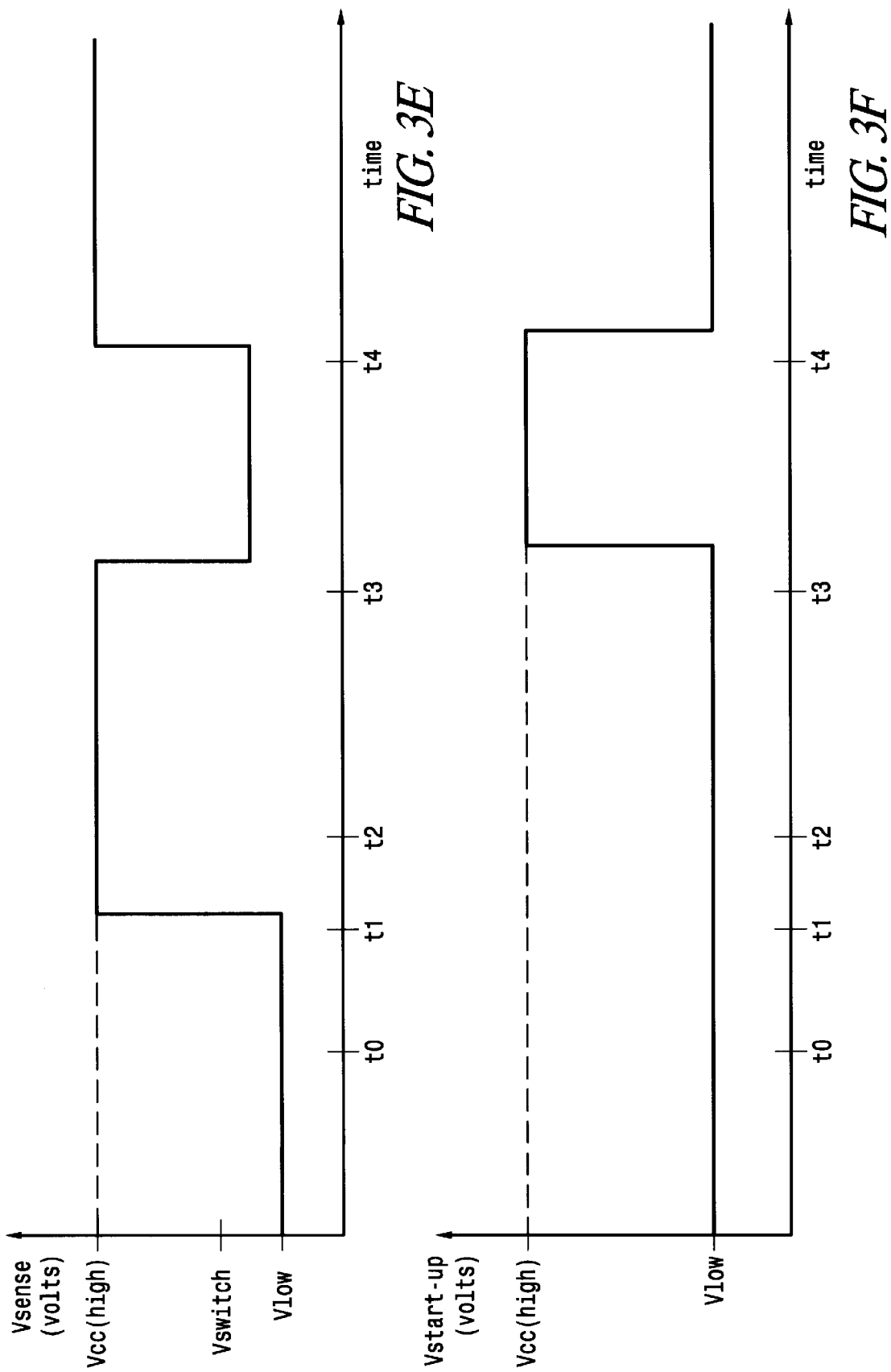

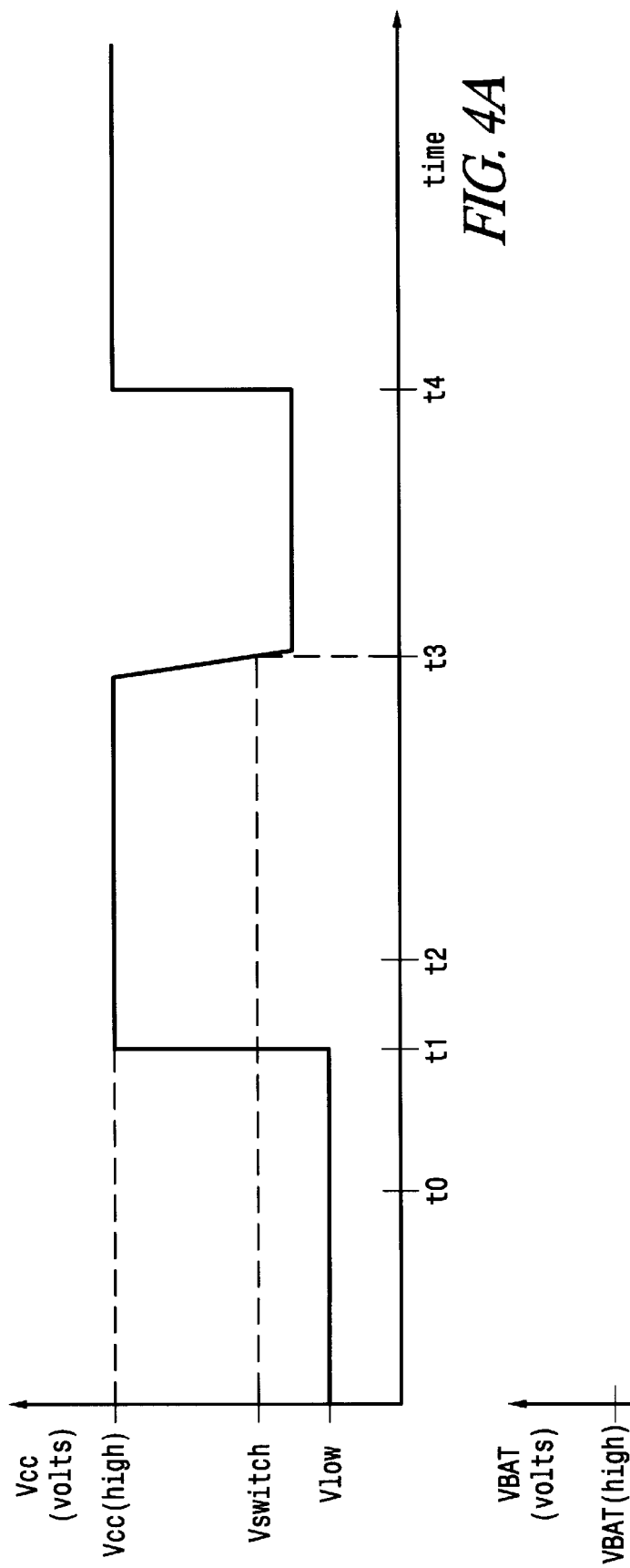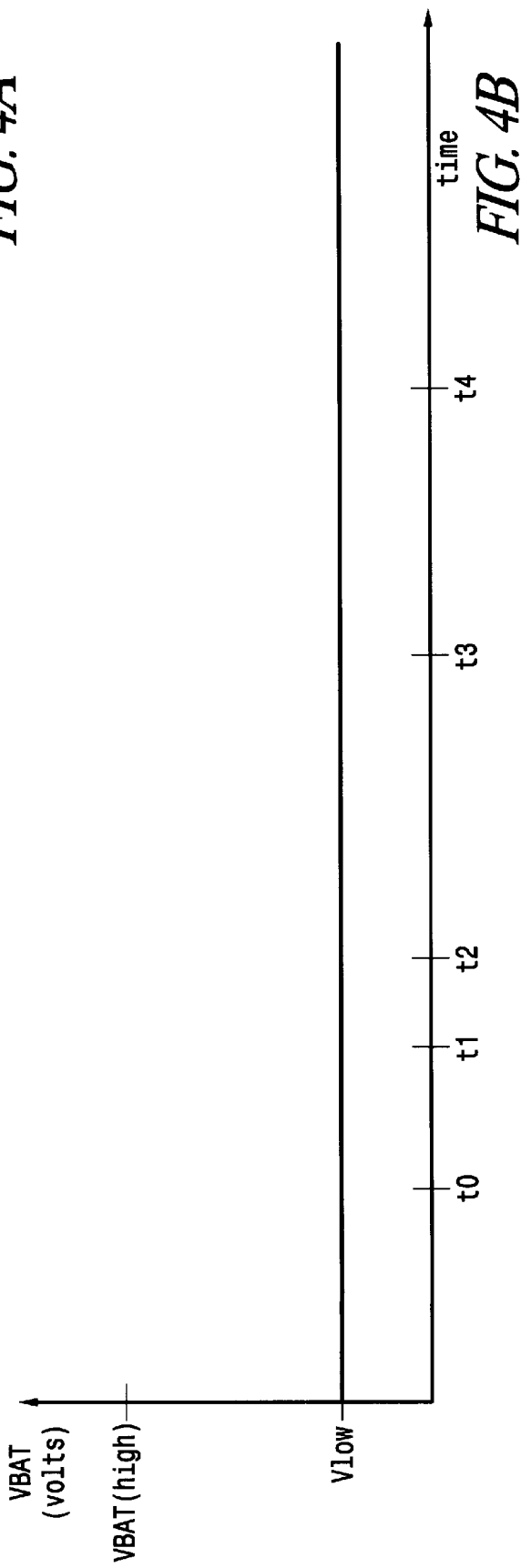

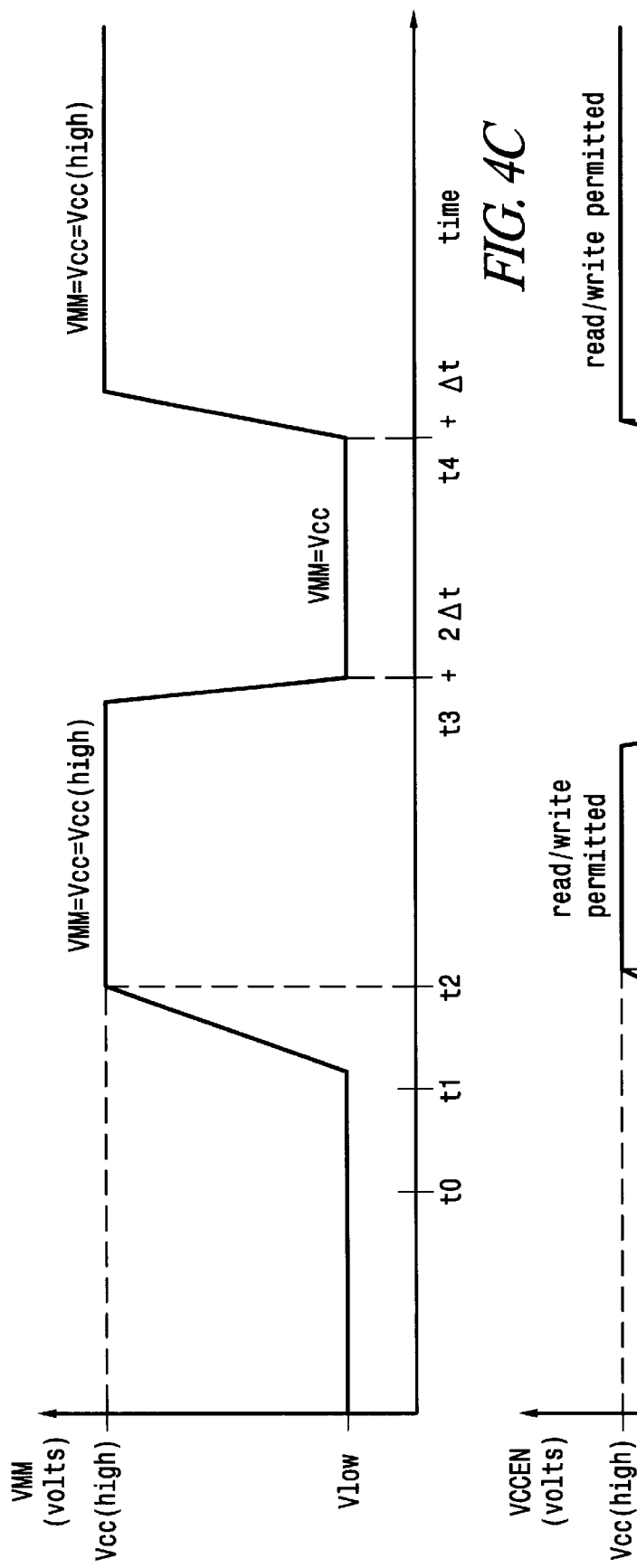
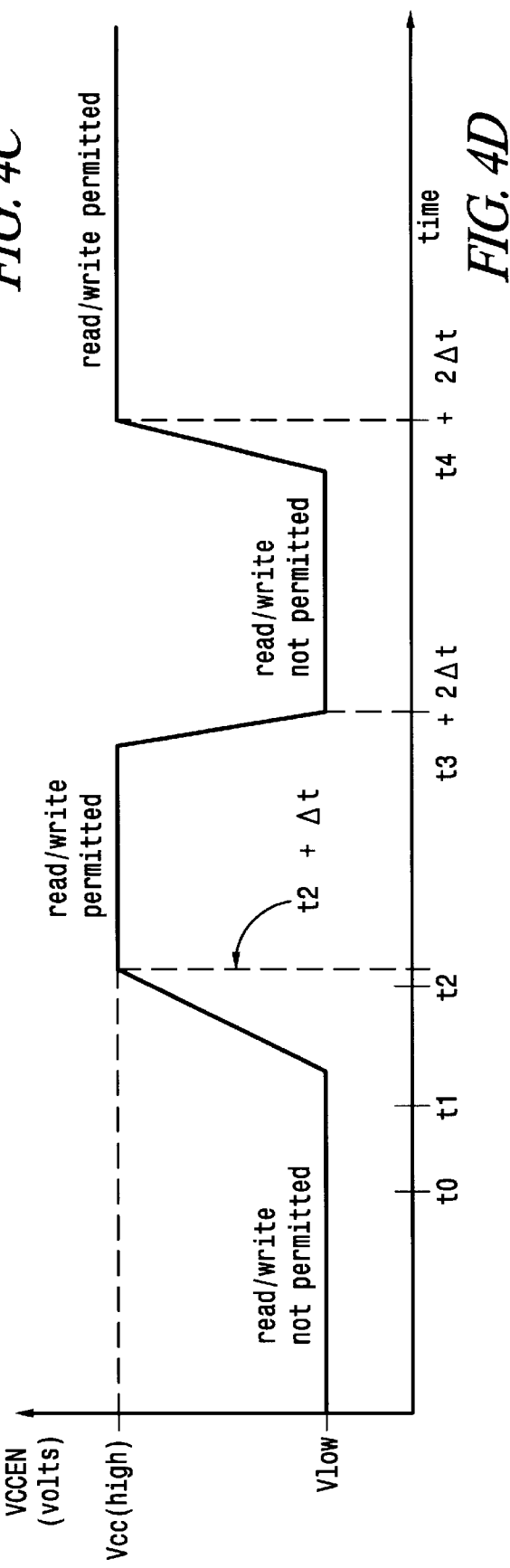
FIG. 4C
FIG. 4D

VOLTAGE SOURCE AND MEMORY-VOLTAGE SWITCH IN A MEMORY CHIP

BACKGROUND OF THE INVENTION

1. Field of the Invention

The present invention relates generally to power supply switching circuits and more specifically to a switching circuit for coupling a memory cell matrix to different voltage sources.

2. Background Art

Conventional memory chips are powered by external positive voltage sources, such as "Vcc," for permitting read and write operations and for sustaining data stored in the memory cell matrix. For example, a Static Random Access Memory (SRAM) chip may be powered by Vcc ranging from about 1.2 volts to about 3.6 volts during low voltage operations. However, conventional memory chips are unable to sustain storage of data in the memory cell matrix if the Vcc voltage level decays below the chip's tolerance. Thus, data stored in the memory cell matrix may be lost if the Vcc voltage is not restored promptly to a level above the chip's tolerance.

What is needed is an SRAM chip which can sustain data in the memory cell matrix for an extended period if the external voltage source powering the memory cell matrix decays below tolerance or is turned off.

SUMMARY OF THE INVENTION

The present invention provides a circuit for connecting a memory cell matrix to voltage sources. The circuit includes a memory cell matrix for storing data, a voltage sensor responsive to the voltage levels of a first voltage source and of a second voltage source by producing a sense signal, and a voltage source coupler connected between the memory cell matrix and the voltage sensor. When the first voltage source voltage level is greater than a threshold voltage level (which may be above the voltage level required to sustain memory cell data), the voltage sensor sense signal causes the voltage source coupler to drive the first voltage source voltage level into the memory cell matrix. When the first voltage source voltage level falls to or below the threshold voltage level, the voltage sensor sense signal also causes the voltage source coupler to drive the second voltage source voltage level into the memory cell matrix.

The invention further provides a method of connecting a memory cell matrix to voltage sources to sustain stored memory cell matrix data, including the steps of: (a) pulling up the voltage levels of a first voltage source and of a second voltage source; (b) pulling up the voltage level of a memory cell matrix to the voltage level of the first voltage source (of step (a)) to permit read and write operations to the memory cell matrix; and (c) if the voltage level of the first voltage source (of step (a)) falls to or below a threshold voltage, then maintaining the voltage level of the memory cell matrix at the voltage level of the second voltage source of (step (a)) to preserve data in the memory cell matrix.

The invention also provides a non-volatile integrated circuit memory device. The integrated circuit memory device includes an integrated circuit package configured to receive a first voltage level from a first voltage source. The integrated circuit package supports a second voltage source for providing a second voltage level and an integrated circuit chip including a memory cell matrix for storing data and a sense-and-switch circuit coupled to the first voltage source, the second voltage source and the memory cell matrix. In response to the first voltage level, when the first voltage level is above a predetermined threshold voltage level the sense-and-switch circuit drives the first voltage level to the memory cell matrix. In response to the first voltage level, when the first voltage level falls to threshold voltage level, the sense-and-switch circuit drives the second voltage level to the memory cell matrix.

The invention has the advantage of providing a non-volatile memory chip which can sustain data for an extended period of time even if the external voltage source (Vcc) powering the chip decays below tolerance or is turned off. Additionally, if Vcc decays below tolerance or is turned off, then the invention provides write protection for the memory cell matrix. The invention permits the memory cell matrix to retain data for an extended period without receiving power from the Vcc source.

Further, by eliminating or reducing the need to rewrite previously-stored memory cell data, the invention permits memory chips with limited write cycles (e.g., flash-memory chips) to become useful for extended periods.

Another advantage of the invention is that the memory chip does not require any external circuitry for monitoring the Vcc voltage level or for sustaining data in the memory cell matrix if the Vcc source decays. Additionally, the invention permits applying the Vcc source voltage to the memory cell matrix at any desired time to allow read and write operations.

A further advantage of the invention is that it prevents battery leakage during package fabrication, thereby preventing damage to and drainage of the memory chip's second voltage source (battery) which provides power to the memory cell matrix when the Vcc source decays below tolerance or is turned off.

BRIEF DESCRIPTION OF THE DRAWINGS

FIGS. 1B and 1C are timing diagrams which illustrate the switching of internal memory voltage VMM to either the battery or Vcc voltage level;

FIGS. 3A–3F are timing diagrams for analyzing a method of operation of the memory-voltage switch circuit of the invention;

FIGS. 4A–4F are timing diagrams for analyzing a method of operation of the invention without a battery;

DETAILED DESCRIPTION OF THE PREFERRED EMBODIMENTS

Figure 1A:
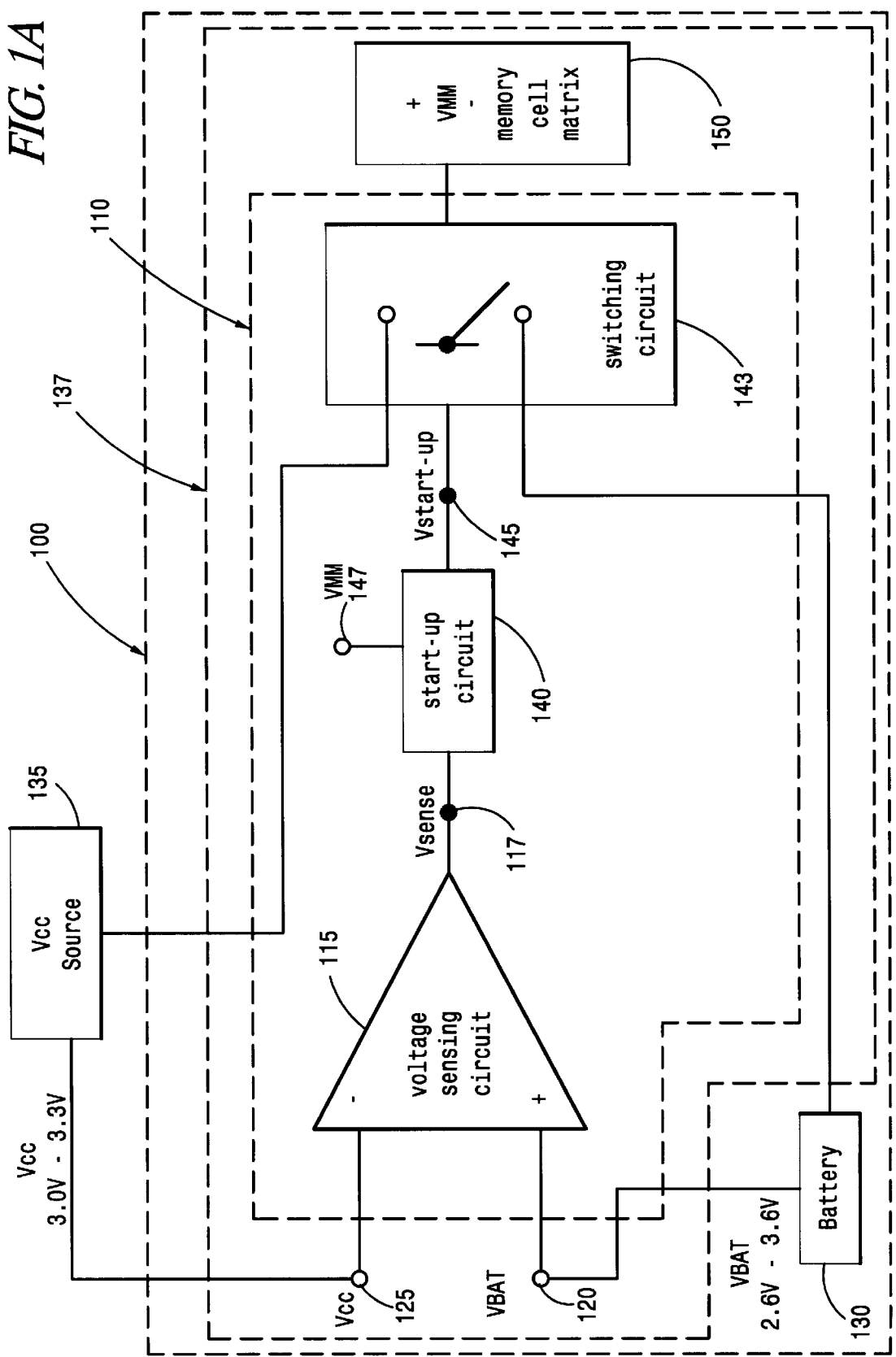
FIG. 1A is a block diagram of an integrated circuit chip incorporating the present invention.

FIG. 1A is a block diagram of an SRAM package 100 containing a battery 130 and an integrated circuit chip or die 137 which incorporates a memory-voltage switch ("sense-and-switch") circuit 110 according to the present invention, and a memory cell matrix 150. Memory cell matrix 150 may include, but is not limited to, a 32K×8 bit ultra-low voltage Static Random Access Memory (SRAM). An exemplary SRAM package 100 will be commercially available from Enable Semiconductor, Inc. of San Jose, Calif. Data sheets for the SRAM package 100, which are incorporated herein by reference, are available from Enable Semiconductor, Inc.

According to a preferred embodiment of the invention, memory-voltage switch circuit 110 includes a voltage sensing circuit (or voltage sensor) 115 and a voltage source coupler including a start-up circuit 140 and a switching circuit 143. Voltage sensing circuit 115 is preferably a differential amplifier (with a gain stage) for producing an amplified output signal or voltage ("Vsense" or sense signal) through node 117. Voltage sensing circuit 115 senses the levels of voltages or signals, "VBAT" and "Vcc," at VBAT node 120 and Vcc node 125, respectively. VBAT is the voltage level of a lithium source or battery 130 which is preferably disposed inside package 100 and is used for biasing voltage sensing circuit 115, while Vcc is the voltage level of an external Vcc source 135. Preferably, battery 130 has a voltage level ranging from about 2.6 volts to about 3.6 volts, while Vcc source 135 has a voltage level ranging from about 3.0 volts to about 3.6 volts. However, the invention may be provided with a battery 130 having other voltage level ranges, for example, from about 1.0 volts to about 2.6 volts. The invention may also be provided with a Vcc source 135 having other voltage level ranges.

Start-up circuit 140, which is coupled between voltage sensing circuit 115 and switching circuit 143, receives the signal Vsense from voltage sensing circuit 115, and outputs a start-up signal or voltage ("Vstart-up") via node 145 to switching circuit 143. Start-up circuit 140 is biased through internal memory voltage node (VMM node) 147 by the internal memory voltage "VMM" of memory cell matrix 150. Switching circuit 143 is coupled between start-up circuit 140 and memory cell matrix 150, and provides switching so that, in response to the value of the Vstart-up signal at node 145, VMM will be switched to either the VBAT or Vcc voltage level.

Figure 1B:
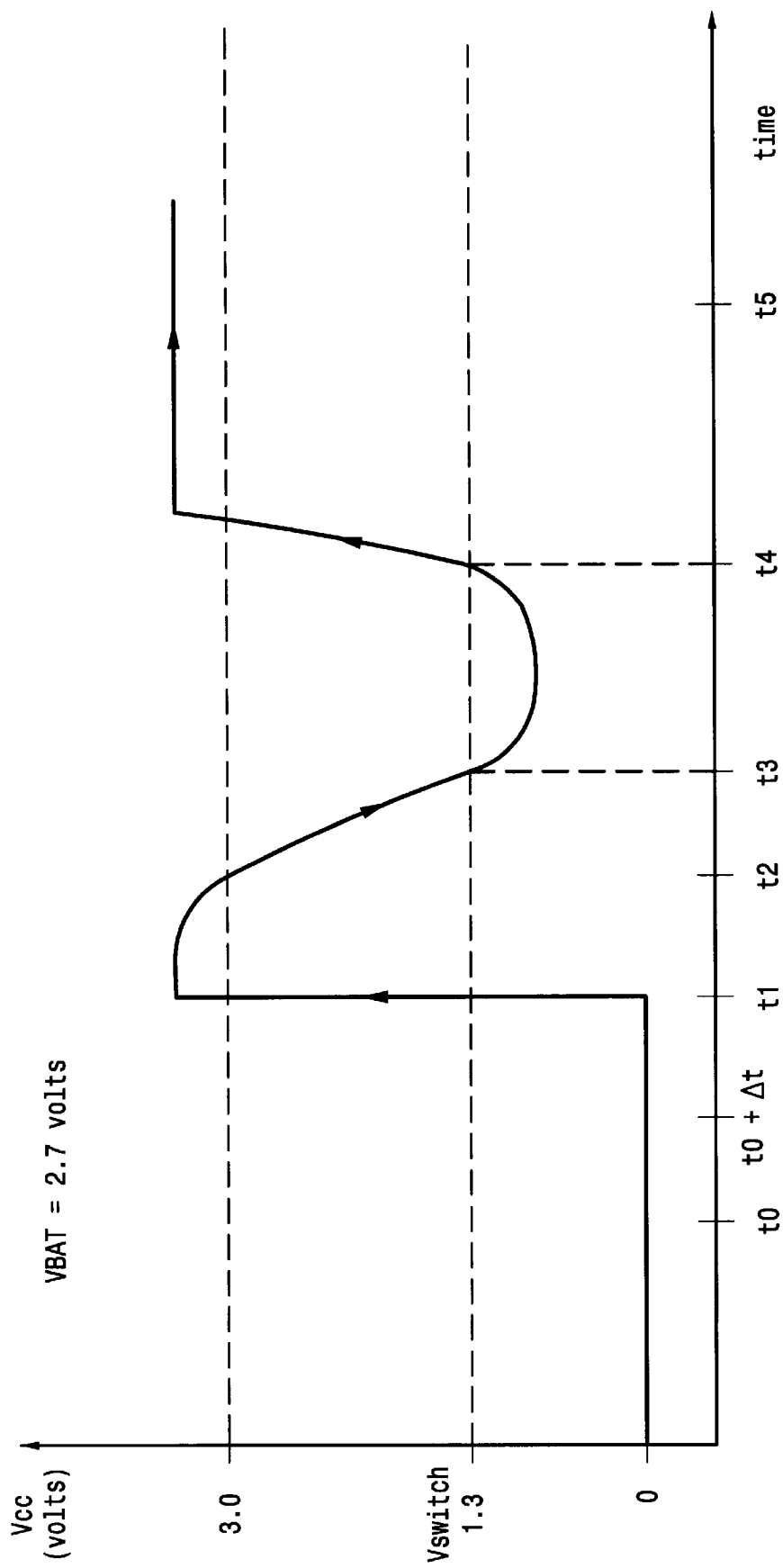

FIGS. 1B and 1C are timing diagrams to further illustrate the switching of memory voltage VMM to the voltage level of either battery 130 or Vcc source 135. In this example, VBAT (battery 130 voltage) has been set to about 2.7 volts and Vcc (Vcc source 135 voltage) to about 3.2 volts. During chip fabrication (time t0), all nodes including Vcc node 125 and VM node 147, are at zero voltage level (FIGS. 1B and 1C). Prior to an initial Vcc power-up, all nodes are preferably kept at zero voltage to prevent leakage current increases as temperature rises.

During package fabrication, battery 130 is connected to memory-voltage switch circuit 110 to drive VBAT node 120 to about 2.7 volts (time t0+Δt). Start-up circuit 140 prevents VMM node 147 from rising to the VBAT voltage level when battery 130 is initially connected to memory-voltage switch circuit 110. After fabrication at time t1, Vcc source 135 is switched on and drives Vcc node 125 above 3.0 volts (FIG. 1B). At time t2 Vcc node 125 will have pulled VMM node 147 above 3.0 volts (FIG. 1C).

The voltage level Vswitch is a predetermined tolerance or threshold voltage level at which VMM switches from the Vcc voltage level to the VBAT voltage level, thereby sustaining stored memory cell data. The Vswitch level is dependent on the VBAT 130 voltage value, on temperature, and on oxide thickness, gate width and other process variables in the transistors of memory-voltage switch circuit 110. In the example FIG. 1B, Vswitch has a value of about 1.3 volts and occurs when Vcc node 125 decays at time t3 in FIG. 1B. When Vcc node 125 falls from about 3.2 volts to about Vswitch at t3 (FIG. 1B), switching circuit 143 connects memory cell matrix 150 to battery 130 and disconnects memory cell matrix 150 from Vcc source 135. Thus, after t3 VMM will be at about the VBAT voltage level (FIG. 1C), thereby permitting data in memory cell matrix 150 to be preserved.

Assume that at time t4 Vcc node 125 is able to return to a level above Vswitch (FIG. 1B). When Vcc node 125 rises above Vswitch, switching circuit 143 connects memory cell matrix 150 to Vcc source 135 and disconnects memory cell matrix 150 from battery 130. Thus, after t4 VMM will be at about the Vcc voltage level (FIG. 1C).

Figure 2:
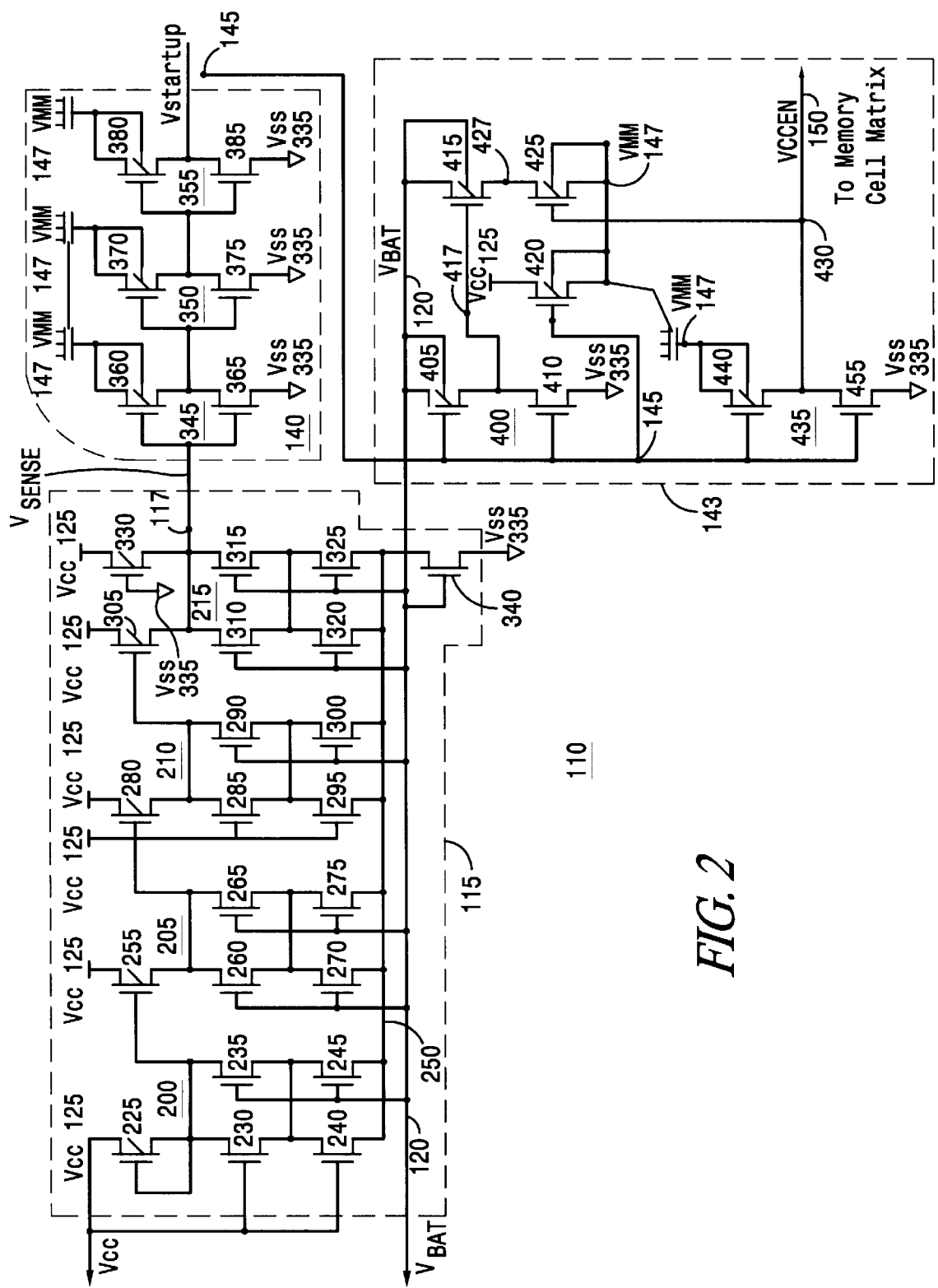
FIG. 2 is a schematic diagram of a memory-voltage switch circuit according to a preferred embodiment of the invention.

FIG. 2 is a schematic diagram of memory-voltage switch circuit 110 according to a preferred embodiment of the invention. Voltage sensing circuit 115 includes four differential amplifier stages 200, 205, 210 and 215 for receiving the Vcc voltage through Vcc node 125 and the VBAT voltage through VBAT node 120, and for providing output signal Vsense through node 117. However, any even number of stages may be employed in voltage sensing circuit 115, depending on design requirements. First stage 200 includes P-channel transistor 225 having its source connected to Vcc node 125, and having its gate and its drain coupled together. The gate of P-Channel transistor 225 is coupled to the junction of the drain of P-channel transistor 225. P-channel transistor 225 also has its drain connected to the drains of N-channel transistors 230 and 235. The sources of N-channel transistors 230 and 235 are connected together and to the drains of N-channel transistors 240 and 245. The sources of N-channel transistors 240 and 245 are connected to node 250 which can be at ground potential ("Vss") or at the voltage level VMM of the memory cell matrix 150 (FIG. 1A). The gates of N-channel transistors 230 and 240 are connected to Vcc node 125, while the gates of N-channel transistors 235 and 245 are connected to VBAT node 120.

Second stage 205 includes P-channel transistor 255 having its source connected to Vcc node 125 and its gate connected to the drains of P-channel transistor 225 and of N-Channel transistors 230 and 235. P-channel transistor 255 has its drain connected to the drains of N-channel transistors 260 and 265. The sources of N-channel transistors 260 and 265 are connected together and to the drains of N-channel transistors 270 and 275. The sources of N-channel transistors 270 and 275 are connected to node 250. The gates of N-channel transistors 260, 265, 270 and 275 are connected to VBAT node 120.

Third stage 210 includes P-channel transistor 280 having its source connected to Vcc node 125 and its gate connected to the drains of P-channel transistor 255 and of N-channel transistors 260 and 265. P-channel transistor 280 has its drain connected to the drains of N-channel transistors 285 and 290. The sources of N-channel transistors 285 and 290 are connected together and to the drains of N-channel transistors 295 and 300. The sources of N-channel transistors 295 and 300 are connected to node 250. The gates of N-channel transistors 285 and 295 are connected to Vcc node 125, while the gates of N-channel transistors 290 and 300 are connected to VBAT node 120.

Fourth stage 215 includes P-channel transistor 305 having its source connected to Vcc node 125 and its gate connected to the drains of P-channel transistor 280 and of N-channel transistors 285 and 290. P-channel transistor 305 has its drain connected to node 117. The drains of N-channel transistors 310 and 315 are also connected to node 117. The sources of N-channel transistors 310 and 315 are connected to the drains of N-channel transistors 320 and 325. The sources of N-channel transistors 320 and 325 are connected to node 250. The gates of N-channel transistors 310, 315, 320 and 325 are connected to VBAT node 120.

Additionally, P-channel leakage transistor 330 has its drain connected to node 117, its source connected to Vcc node 125 and its gate connected to Vss node 335 which is grounded. N-channel transistor 340 has its drain connected to node 250, its source connected to Vss node 335 and its gate connected to VBAT node 120.

Start-up circuit 140 has an input line coupled to node 117 for receiving signal Vsense from voltage sensing circuit 115, and has an output line coupled to node 145 for driving signal Vstart-up to switching circuit 143. Start-up circuit 140 employs three cascaded inverters 345, 350 and 355, but any odd number of cascaded inverters may be implemented, depending on design requirements. The inverters 345, 350 and 355 include P-channel/N-channel transistor pairs 360/365, 370/375 and 380/385, respectively. P-channel transistor 360 and N-channel transistor 365 have their gates connected to Vsense node 117, and their drains connected to the gates of P-channel transistor 370 and N-channel transistor 375. P-channel transistor 370 and N-channel transistor 375 have drains connected to the gates of P-channel transistor 380 and N-channel transistor 385. P-channel transistor 380 and N-channel transistor 385 have drains connected to Vstart-up node 145. The sources and bulks (substrate connections) of P-channel transistors 360, 370 and 380 are connected to VMM node 147 which is at the voltage level of the memory voltage VMM. The sources of N-channel transistors 365, 375 and 385 are connected to Vss node 335.

Switching circuit 143 receives signal Vstart-up at node 145 for switching the memory voltage VMM level to the level of either Vcc node 125 or VBAT node 120. Switching circuit 143 includes inverters 400 and 435. Inverter 400 includes P-channel transistor 405 and N-channel transistor 410 having their gates connected to node 145 and their drains connected via node 417 to the gate of P-channel switch transistor 415. The source of N-channel transistor 410 is connected to Vss node 335, while the sources and bulks of P-channel transistors 405 and 415 are connected to VBAT node 120.

P-channel switch transistor 420 has its gate connected to node 145 and its source connected to Vcc node 125. The source of P-channel switch transistor 425 and the drain of P-channel switch transistor 415 are connected together at node 427. The drains and bulks of P-channel switch transistors 420 and 425 are connected to nod n ode 147. Additionally, the gate of P-channel switch transistor 425 is connected to VCCEN node 430 which drives an enable signal, "VCCEN," for permitting read and write operations to memory cell matrix 150. When VMM=Vcc, read and write operations are allowed to memory cell matrix 150. When VMM=VBAT, read and write operation s are disallowed to memory cell matrix 150.

Inverter 435 includes P-channel transistor 440 and N-channel transistor 445 having their gates connected to node 145 and their drains connected to VCCEN node 430. N-channel transistor 445 has its source connected to Vss node 335, while P-channel transistor 440 has its source and bulk connected to VMM node 147. In an alternative embodiment (not shown), P-channel transistor 440 has its source and bulk connected to Vcc node 125 instead of VMM node 147. Inverter 435 outputs the signal VCCEN in response to the signal Vstart-up at node 145.

Memory-voltage switch circuit 110 also satisfies the following conditions. First, memory-voltage switch circuit 110 can operate at from about 0 degrees Celsius to about 125 degrees Celsius under all process variations. Second, current is not drawn through battery 130 (FIG. 1A). Third, when the battery 130 voltage level is at from about 2.6 volts to about 3.6 volts, Vcc source 135 current "Icc" (not shown) is minimal (less than about 100 micro-amperes), while battery 130 current "IBAT" (not shown) is at about 0 ampere except during transitions. Additionally, when the VBAT voltage level is at about 0 volts, then Icc and IBAT are each at about 0 ampere.

In order to prevent latchup, the source voltage and the drain voltage of a PMOS transistor can never be one diode drop (typically 0.6 volts) greater than its substrate connection voltage. Thus, for P-channel switch transistors 415, 420 and 425, the substrate connection voltages should be above the source and drain voltages to insure the prevention of latchup. As stated above, the voltage at VBAT node 120 may range for example from about 2.6 volts to about 3.6 volts, while the voltage at Vcc node 125 may range for example from about 3.0 volts to about 3.6 volts. The following example (see Tables 1 to 5) demonstrates how the present invention prevents latchup. Table 1 shows three conditions for different voltages at Vcc node 125, VBAT node 120 and VMM node 147.

TABLE 1

| condition | Vcc | VBAT | VMM voltage |
|---|---|---|---|
| 1 | 3v | 3.6v | VMM = Vcc = 3v |
| 2 | 3.6 | 2.6 | VMM = Vcc = 3.6 |
| 3 | 0 | 2.6 | VMM = VBAT = 2.6 |

Table 2 shows the voltages at node 145 (gate of P-channel switch transistor 420), node 417 (gate of P-channel switch transistor 415), VCCEN node 430 (gate of P-channel switch transistor 425) and node 427 for conditions 1 to 3 of Table 1. Under condition 1, a 3.6 volt signal at node 417 turns off P-channel switch transistor 415, while a 3.0 volt signal at node 430 turns off P-channel switch transistor 425. Thus, under condition 1 node 427 floats to the VMM node 147 voltage of 3.0 volts. Under condition 2, a 2.6 volt signal at node 417 turns on P-channel switch transistor 415, while a 3.6 volt signal at node 430 turns off P-channel switch transistor 425. Thus, under condition 2 node 427 floats to the VBAT node 120 voltage of 2.6 volts. Under condition 3, 0 volt signals at nodes 417 and 430 turn on P-channel switch transistor 415 and P-channel switch transistor 425, respectively, to pull VMM node 147 and node 427 to the VBAT node 120 voltage of 2.6 volts.

TABLE 2

| condition | Vcc | VBAT | VMM | 145 | 417 | 430 | 427 |
|---|---|---|---|---|---|---|---|
| 1 | 3v | 3.6v | 3v | 0v | 3.6v | 3v | 3v |
| 2 | 3.6 | 2.6 | 3.6 | 0 | 2.6 | 3.6 | 2.6 |
| 3 | 0 | 2.6 | 2.6 | 2.6 | 0 | 0 | 2.6 |

Tables 3, 4 and 5 show the gate voltages ("Vgate"), source voltages ("Vsource"), drain voltages ("Vdrain") and substrate connection voltages ("Vsubs") of P-channel switch transistors 420, 415 and 425, respectively, under all three conditions in Table 1. Since Vsubs≧Vsource and Vsubs≧Vdrain for P-channel switch transistors 420, 415 and 425 under all conditions, latchup is prevented.

TABLE 3

(P-channel switch transistor 420)

| condition | Vgate | Vsource | Vdrain | Vsubs | latchup? |
|---|---|---|---|---|---|
| 1 | 0v | 3v | 3v | 3v | No |
| 2 | 0 | 3.6 | 3.6 | 3.6 | No |
| 3 | 2.6 | 0 | 2.6 | 2.6 | No |

TABLE 4

(P-channel switch transistor 415)

| condition | Vgate | Vsource | Vdrain | Vsubs | latchup? |
|---|---|---|---|---|---|
| 1 | 3.6v | 3.6v | 3.0v | 3.6v | No |
| 2 | 2.6 | 2.6 | 2.6 | 2.6 | No |
| 3 | 0 | 2.6 | 2.6 | 2.6 | No |

TABLE 5

(P-channel switch transistor 425)

| condition | Vgate | Vsource | Vdrain | Vsubs | latchup? |
|---|---|---|---|---|---|
| 1 | 3.0v | 3v | 3v | 3v | No |
| 2 | 3.6 | 2.6 | 3.6 | 3.6 | No |
| 3 | 0 | 2.6 | 2.6 | 2.6 | No |

FIGS. 3A–3F are timing diagrams for analyzing the method of operation of memory-voltage switch circuit 110. A high logic Vcc voltage level is about equal to "Vcc(high)," while a high logic VBAT voltage level is about equal to "VBAT(high)." The low logic level "Vlow" is about equal to ground potential. As stated above, Vcc can range for example from about 3.0 volts to about 3.6 volts, while VBAT can range for example from about 2.6 volts to about 3.6 volts. During package fabrication (time t0), all nodes including Vcc node 125, VBAT node 120, VMM node 147, VCCEN node 430, Vsense node 117 and Vstart-up node 145, are at zero voltage level (FIGS. 3A–3F). As stated above, prior to an initial Vcc power-up, all nodes are preferably kept at zero voltage to prevent leakage current increases as temperature rises. This zero voltage condition requires that memory cell matrix 150 be disconnected from both Vcc source 135 and battery source 130. At time t0+Δt during packaging, VBAT source 130 is connected to memory-voltage switch circuit 110 (FIG. 1A) to drive VBAT node 120 to the VBAT(high) high logic level (FIG. 3B).

As stated above, voltage sensing circuit 115 is biased by the VBAT voltage of battery 130. When VBAT is active, N-channel transistor 340 enables stages 200, 205, 210 and 215. Thus, a high logic level VBAT voltage being driven onto its gate turns on N-channel transistor 340, thereby enabling stages 200, 205, 210 and 215. Conversely, when VBAT is grounded N-channel transistor 340 disables stages 200, 205, 210 and 215. Thus, a low logic level VBAT signal being driven onto its gate turns off N-channel transistor 340, thereby disabling stages 200, 205, 210 and 215.

At time t0, signal Vstart-up (FIG. 3F) at node 145 is at a low logic level and is being driven into the inputs of inverters 400 and 435 and into the gate of P-channel transistors 420.

After fabrication at time t1, Vcc source 135 is switched on and drives Vcc node 125 to a high logic level (FIG. 3A). At time t1, P-channel switch transistor 420 is on, since its gate is receiving signal Vstart-up at a low logic level. At a subsequent time t2, Vcc node 125 through P-channel transistor 420 pulls VMM node 147 to a high logic level (FIG. 3C). Voltage sensing circuit 115 also switches node 117 signal Vsense (FIG. 3E) from a low logic level to a high logic level. Voltage sensing circuit 115 is preferably a differential amplifier which outputs signal Vsense at a high logic level when it receives a high logic level Vcc input from Vcc node 125 and a high logic level VBAT input from VBAT node 120.

When VMM node 147 rises to a high logic level at t2 (FIG. 3C), it biases inverters 345, 350 and 355 to propagate the high logic level signal Vsense. Start-up circuit 140 inverts the high logic level signal Vsense from node 117 to a low logic level signal Vstart-up (FIG. 3F) at node 145.

At time t2 VMM node 147 rises to a high logic level and biases inverter 435 to switch the Vstart-up signal at node 145 from a low logic level to a high logic level output at VCCEN node 430 at time t2+Δt (FIG. 3D). The high logic level of VCCEN node 430 enables read and write operations on memory cell matrix 150.

As stated previously, the voltage level Vswitch is a predetermined tolerance or threshold voltage level, effectively a low logic level, which occurs when Vcc node 125 decays at time t3 in FIG. 3A. For example, Vswitch may be at about 1.3 volts. When Vcc node 125 falls from its normal high logic level to Vswitch, the voltage sensing circuit 115 switches node 117 signal Vsense (FIG. 3E) from a high logic level to a low logic level. The low logic level signal Vsense then propagates through inverters 345, 350 and 355 to be inverted to a high logic level signal Vstart-up (FIG. 3F) at node 145. The high logic level signal Vstart-up at node 145 is then switched by inverters 400 and 435 to low logic level outputs. The high logic level signal Vstart-up at node 145 is also driven onto the gate of P-channel switch transistor 420 to turn it off. The resulting low logic level outputs from inverters 400 and 435 turn on P-channel switch transistors 415 and 425, respectively. The low logic level output of inverter 435 also drives VCCEN node 430 to a low logic level at t3+Δt (FIG. 3D) to prevent read and write operations on memory cell matrix 150.

Since P-channel switch transistors 415 and 425 are turned on at time t3+2Δt, VBAT node 120 maintains VMM node 147 at the VBAT(high) high logic level (FIG. 3C) which sustains data stored in memory cell matrix 150. When Vcc decays below Vswitch, this invention can preserve data in memory cell matrix 150 for an extended period.

Assume that at time t4 Vcc node 125 is able to return to the Vcc(high) high logic level (FIG. 3A) or to at least above Vswitch. Voltage sensing circuit 115 (FIG. 3E) will switch signal Vsense at node 117 from a low logic level to a high logic level, which then propagates through inverters 345, 350 and 355 to be inverted to a low logic level Vstart-up signal at node 145 (FIG. 3F). Inverters 400 and 435 switch the low logic level signal Vstart-up to high logic level outputs to turn off P-Channel switch transistors 415 and 425, respectively. The low logic level Vstart-up signal is also driven onto the gate of P-channel switch transistor 420 to turn it on. When P-channel switch transistor 420 is on at t4+Δt (FIG. 3C), Vcc node 125 pulls VMM node 147 to the high logic level of Vcc.

Additionally, the inverter 435 high logic level output drives VCCEN node 430 to a high logic level at t4+2Δt (FIG. 3D) to again permit read and write operations to memory cell matrix 150.

FIGS. 4A–4F are timing diagrams illustrating the method of operation of memory-voltage switch circuit 110 of the invention when battery 130 is not installed. During package fabrication (time t0), all nodes including Vcc node 125, VBAT node 120, VMM node 147, VCCEN node 430, (Vsense) node 117 and (Vstart-up) node 145, are at zero voltage level (FIGS. 4A–4F).

Since VBAT node 120 is grounded, N-channel transistor 340 disables stages 200, 205, 210 and 215.

Figure 4E:
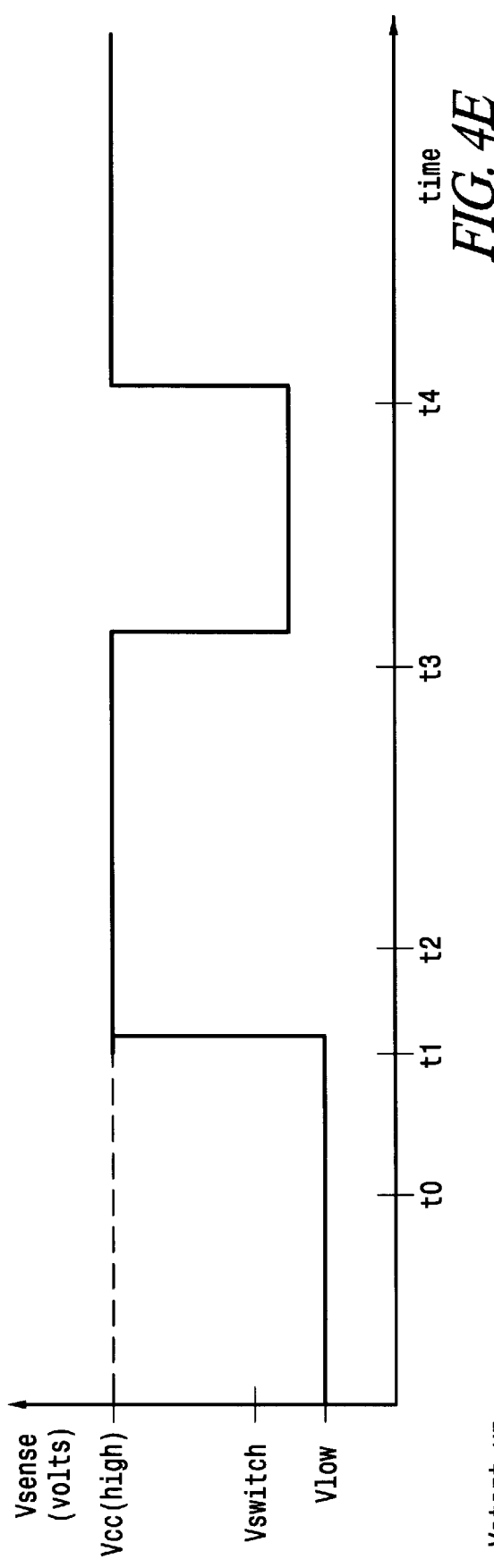

At time t1, Vcc source 135 is switched to the Vcc(high) high logic level which drives Vcc node 125 (FIG. 4A). Since battery 130 is not installed in package 100 (FIG. 1A), VBAT node 120 remains at a low logic level (FIG. 4B), leaving inverter 400 and P-channel switch transistors 415 and 425 un-biased. The signal Vsense, at node 117, is switched from a low logic level to a high logic level when Vcc node 125 pulls up node 117 through P-channel leakage transistor 330 (FIG. 4E).

At time t1, the low logic level signal Vstart-up at the gate of P-channel switch transistor 420 turns it on. At a subsequent time t2 Vcc node 125 pulls VMM node 147 to a high logic level through P-channel transistor 420 (FIG. 4C). Then, the high logic level signal Vsense propagates through inverters 345, 350 and 355 to be inverted to a low logic level at node 145 (signal Vstart-up at FIG. 4F).

VMM node 147 going to a high logic level at time t2+Δt biases inverter 435 which switches the low logic level signal Vstart-up at node 145 to a high logic level output at VCCEN node 430 (FIG. 4D). The high logic level of VCCEN node 430 enables read and write operations on memory cell matrix 150.

Figure 4F:
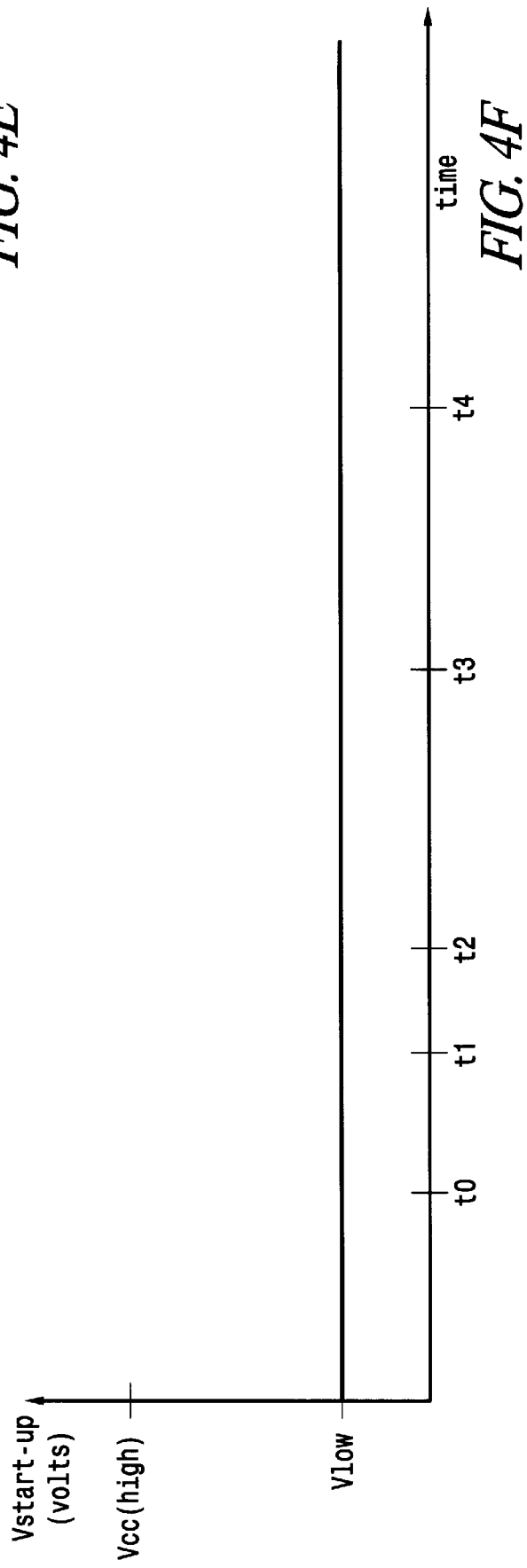

Assume that at time t3 Vcc node 125 decays below the predetermined tolerance voltage level Vswitch (FIG. 4A). Since the gate of P-channel switch transistor 420 is receiving a low logic level signal, transistor 420 remains on at time t3. As Vcc node 125 falls below Vswitch, VMM node 147 also falls below Vswitch since VMM=Vcc (FIG. 4C). At time t3+Δt, VMM node 147 falls to a low logic level, thereby driving VCCEN node 430 to a low logic level at t3+2Δt (FIG. 4D), while the signal Vstart-up remains at a low logic level (FIG. 4F). The low logic level of VCCEN node 430 prevents read and write operations on memory cell matrix 150. Additionally, since Vcc node 125 is at a low logic level, Vsense switches from a high to a low logic level (FIG. 4E).

Assume that at time t4 Vcc node 125 is able to return to the Vcc(high) high logic level (FIG. 4A) or to at least above Vswitch. Thus, Vcc node 125 is able through P-channel switch transistor 420 to pull VMM node 147 to a high logic level at time t4+Δt (FIG. 4C). When Vcc node 125 through P-channel leakage transistor 330 pulls up node 117, the signal Vsense (FIG. 4E) is again switched to a high logic level signal which then propagates through inverters 345, 350 and 355 to be inverted to a low logic level signal Vstart-up at node 145 (FIG. 4F). Inverter 435 switches the low logic level signal Vstart-up to a high logic level signal at VCCEN node 430 by time t4+2Δt (FIG. 4D). Since VCCEN node 430 is at a high logic level, read and write operations on memory cell matrix 150 are again permitted.

Figure 5:
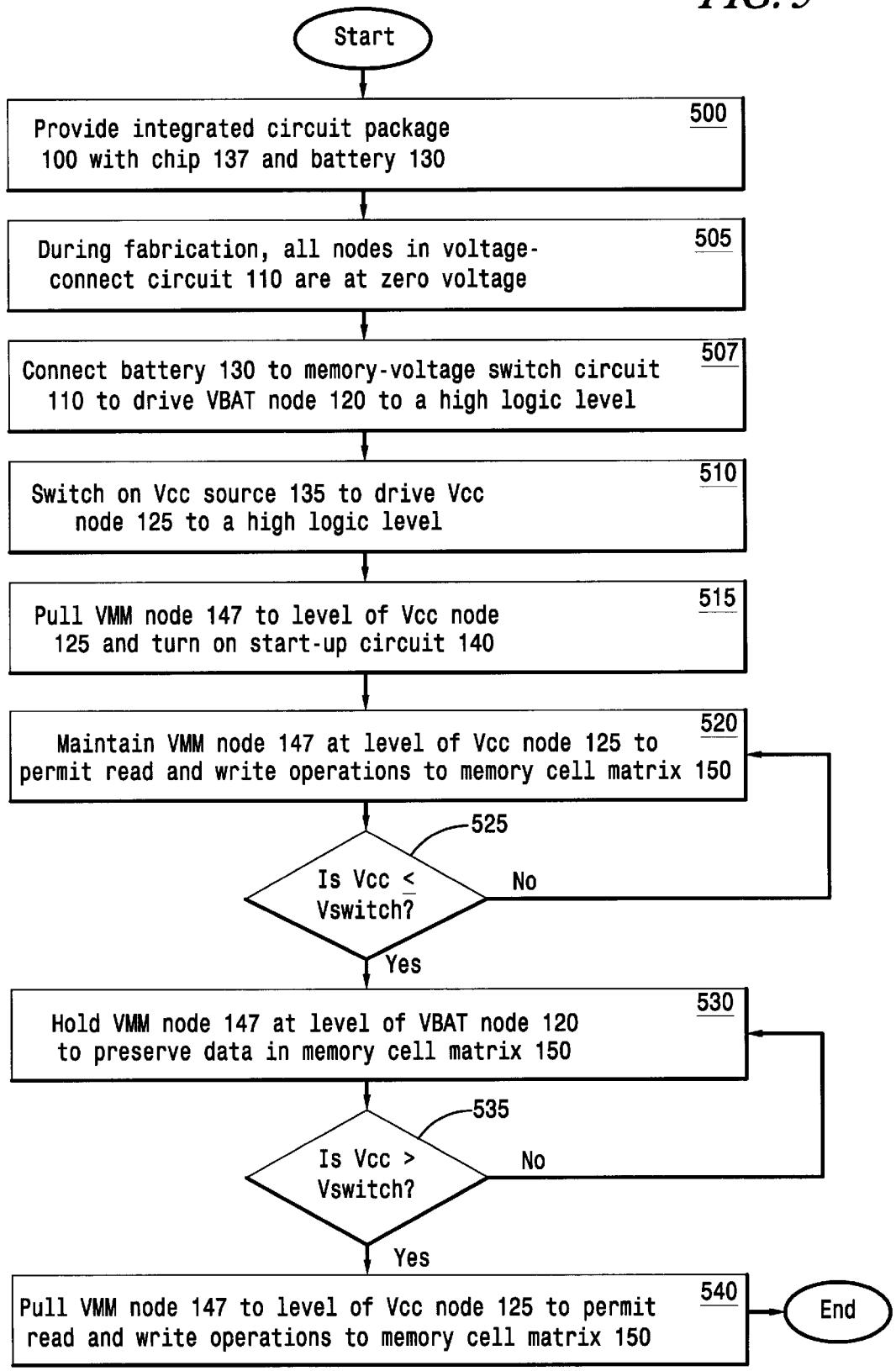
FIG. 5 is a block diagram illustrating steps in a method of operation according to the invention.

FIG. 5 is a flow chart illustrating steps in a method of operation according to the invention. An integrated circuit package 100 including a chip 137 and a battery 130 is provided as shown in step 500. During fabrication of integrated circuit package 100, all nodes in memory-voltage switch circuit 110 are at zero voltage level (step 505). In step 507, battery 130 is connected to memory-voltage switch circuit 110 to drive VBAT node 120 to a high logic level. In step 510, Vcc source 135 is switched on to drive Vcc node 125 to a high logic level and to drive the battery 130 voltage to VBAT node 120. In step 515, Vcc node 125 pulls VMM node 147 to a high logic level and turns on start-up circuit 140. Maintaining VMM node 147 at the high logic level of Vcc node 125 permits read and write operations on memory cell matrix 150 (step 520).

In step 525, memory-voltage switch circuit 110 determines whether the level of Vcc node 125 has fallen to or below the Vswitch voltage level. If Vcc node 125 has not fallen to Vswitch, then VMM node 147 remains at the level of Vcc node 125 (step 520). If Vcc node 125 has fallen to Vswitch, the invention proceeds to step 530 during which VMM node 147 is maintained at the high logic level of VBAT node 120. The high logic level of VMM node 147 preserves data stored in memory cell matrix 150.

In step 535 the invention determines if Vcc node 125 has been restored to a voltage level above Vswitch. If not, then VMM node 147 remains at the level of VBAT node 120 (step 530). If Vcc node 125 has risen to above Vswitch, then as shown in step 540 VMM node 147 is pulled to the level of Vcc node 125. The high logic level of VMM node 147 in step 540 permits read and write operations in memory cell matrix 150.

Figure 6:
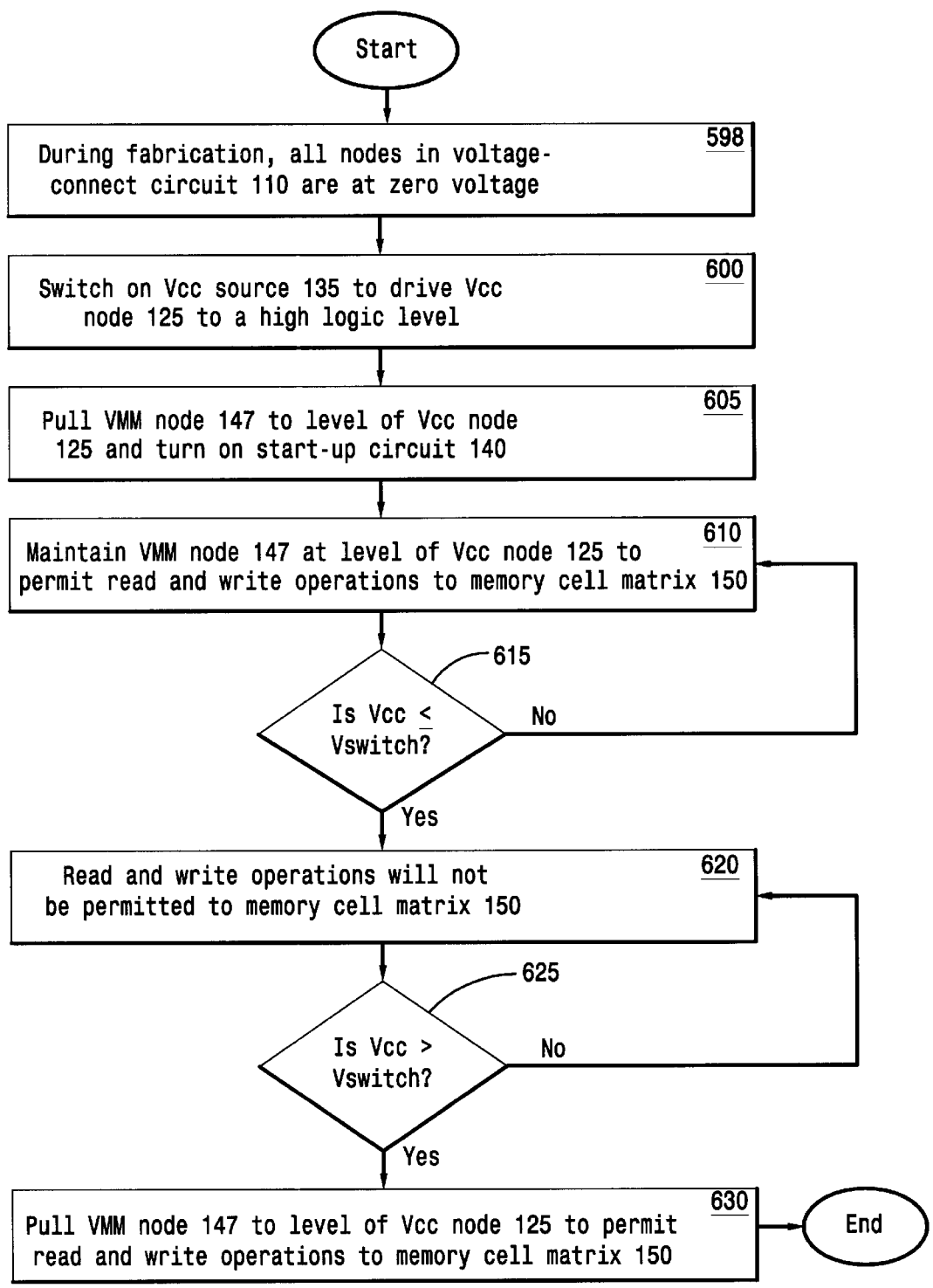
FIG. 6 is a block diagram illustrating steps in a method of operation according to the invention without a battery.

FIG. 6 is a flow chart illustrating steps in a method of operation according to the invention without using a battery 130. During fabrication of integrated circuit package 100, all nodes in memory-voltage switch circuit 110 are at zero voltage level (step 598). In step 600, Vcc source 135 is switched on to drive Vcc node 125 to a high logic level. In step 605, Vcc node 125 pulls =node 147 to a high logic level and turns on start-up circuit 140. VMM node 147 is then maintained at the high logic level of Vcc node 125 to permit read and write operations to memory cell matrix 150 (step 610).

In step 615, the memory-voltage switch circuit 110 determines whether the level of Vcc node 125 has fallen to that of Vswitch. If Vcc node 125 has not fallen to Vswitch, then VMM node 147 remains at the level of Vcc node 125 (step 610). If Vcc node 125 has fallen to Vswitch, the invention proceeds to step 620 during which VMM node 147 is effectively at a low logic level. The low logic level of VMM node 147 will not permit read and write operations to memory cell matrix 150.

In step 625, the invention determines whether Vcc node 125 has risen above Vswitch. If not, then VMM node 147 remains at a low logic level, and read and write operations to memory cell matrix 150 are not permitted (step 620). If Vcc node 125 has risen above Vswitch, then VMM node 147 is pulled to the level of Vcc node 125 as shown in step 630. The high logic level of VMM node 147 in step 630 permits read and write operations to memory cell matrix 150.

Figure 7A:
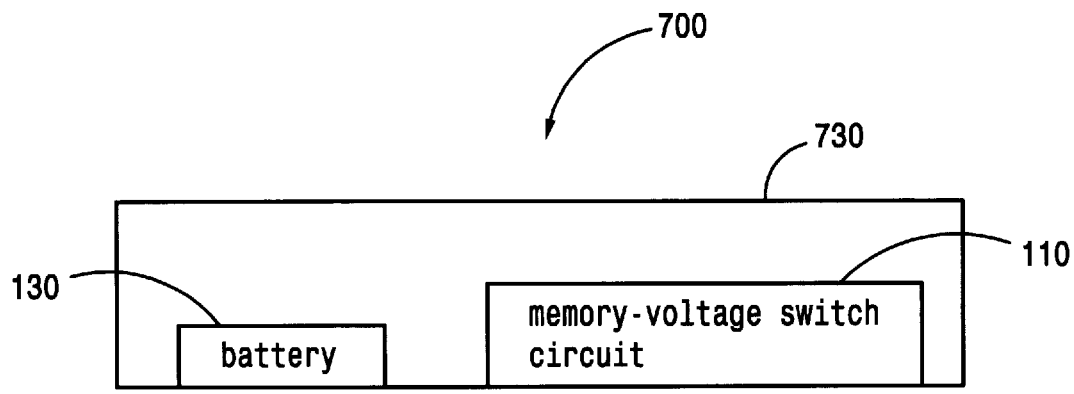
FIGS. 7A and 7B are side elevational views of alternative embodiments of integrated circuit chips incorporating the invention.
Figure 7B:
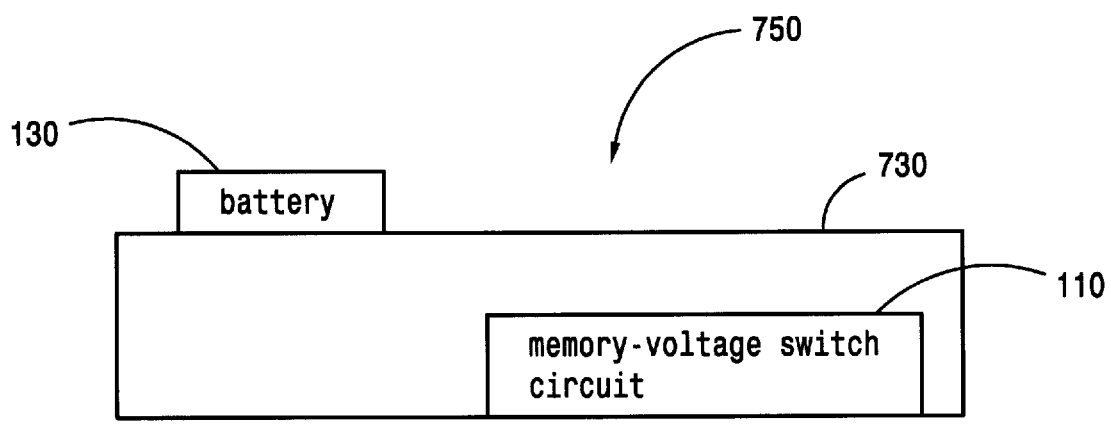

While various embodiments and applications of this invention have been shown and described, it will be apparent to those skilled in the art that modifications are possible without departing from the inventive concepts described herein. For example, FIGS. 7A and 7B illustrate alternate embodiments of the integrated circuit chip incorporating the invention. FIG. 7A shows integrated circuit package 700 with battery 130 and memory-voltage switch circuit 110 installed inside chip housing 730. FIG. 7B shows integrated circuit package 750 with battery 130 installed on the outer surface of chip housing 730. The invention, therefore, is not to be restricted except in the spirit of the appended claims.

What is claimed is:

1. A circuit for connecting a memory cell matrix to first and second voltage sources, comprising:

a memory cell matrix for storing data;

a voltage sensor responsive to the voltage levels of said first and second voltage sources by producing a sense signal;

a voltage source coupler connected between said memory cell matrix and said voltage sensor, and responsive to said sense signal by driving the voltage level of said first voltage source into said memory cell matrix when the voltage level of said first voltage source is greater than a predetermined threshold voltage level and by driving the voltage level of said second voltage source into said memory cell matrix when the voltage level of said first voltage source falls to said threshold voltage level.

2. The circuit of claim 1 wherein said voltage source coupler comprises:

a switching circuit connected to said memory cell matrix for connecting said first voltage source to said memory cell matrix when the voltage level of said first voltage source is greater than said threshold voltage level and for connecting said second voltage source to said memory cell matrix when the voltage level of said first voltage source falls to said threshold voltage level.

3. The circuit of claim 2 wherein said switching circuit comprises:

an input node;

a first inverter having an input terminal connected to said input node for receiving a start-up signal responsive to said sense signal and having an output terminal;

a second inverter having an input terminal connected to said input node for receiving said start-up signal and having an output terminal connected to said memory cell matrix;

a first switch connected to said output terminal of said first inverter and to said second voltage source;

a second switch connected to said first switch, to an internal memory voltage node of said memory cell matrix, and to the output terminal of said second inverter, said first switch and said second switch together being responsive to said start-up signal to connect said second voltage source to said memory cell matrix when the voltage level of said first voltage source falls to said threshold voltage level; and a third switch connected to said input node for receiving said start-up signal, to said first voltage source, and to said internal memory voltage node, and being responsive to said start-up signal to connect said first voltage source to said memory cell matrix when the voltage level of said first voltage source is greater than said threshold voltage level.

4. The circuit of claim 3 wherein:

said first switch comprises a first P-channel transistor having a source connected to said second voltage source, a gate connected to said output terminal of said first inverter, and a drain;

said second switch comprises a second P-channel transistor having a source connected to said drain of said first P-channel transistor, a drain connected to said internal memory voltage node, and a gate connected to said output terminal of said second inverter; and said third switch comprises a third P-channel transistor having a source connected to said first voltage source, a drain connected to said internal memory voltage node, and a gate connected to said input node.

5. The circuit of claim 3 wherein said second inverter is responsive to said start-up signal by driving an enable signal to said memory cell matrix to permit read and write operations when said first voltage source is connected to said memory cell matrix.

6. The circuit of claim 2 wherein said voltage coupler comprises:

a start-up circuit connected between said voltage sensor and said switching circuit, and responsive to said sense signal by providing an inverted delayed start-up signal to permit said switching circuit to connect said first voltage source to said memory cell matrix when the voltage level of said first voltage source is greater than said threshold voltage level and to connect said second voltage source to said memory cell matrix when the voltage level of said first voltage source falls to said threshold voltage level.

7. The circuit of claim 6 wherein said start-up circuit comprises an odd number of inverters.

8. The circuit of claim 1 wherein said voltage sensor comprises:

a differential amplifier configured to sense the voltage levels of said first voltage source and of said second voltage source, and to respond by producing a sense signal to permit said voltage source coupler to drive the voltage level of said first voltage source into said memory cell matrix when the voltage level of said first voltage source is greater than said threshold voltage level and to respond by producing a sense signal to permit said voltage source coupler to drive the voltage level of said second voltage source into said memory cell matrix when the voltage level of said first voltage source falls to said threshold voltage level.

9. A circuit for connecting a memory cell matrix to voltage sources, comprising:

a memory cell matrix for storing data;

a first voltage source for providing a first voltage level;

a second voltage source for providing a second voltage level; and a sense-and-switch circuit coupled to said first voltage source, said second voltage source and said memory cell matrix, and responsive to said first voltage level and said second voltage level by driving said first voltage level to said memory cell matrix when said first voltage level is above a predetermined threshold voltage level and by driving said second voltage level to said memory cell matrix when said first voltage level falls to said threshold voltage level.

10. The circuit of claim 9 wherein said sense-and-switch circuit further comprises:

a voltage sensor responsive to said first voltage level and said second voltage level by producing a sense signal;

a start-up circuit connected to said voltage sensor for receiving, inverting and delaying said sense signal to provide a start-up signal; and a switching circuit connected between said start-up circuit and said memory cell matrix, and responsive to said start-up signal by connecting to said memory cell matrix said first voltage source when said first voltage level is above said threshold voltage level and said second voltage source when said first voltage level falls to said threshold voltage level.

11. The circuit of claim 10 wherein said switching circuit further comprises:

a first inverter having an input terminal connected to said start-up circuit for receiving said start-up signal and having an output terminal;

a second inverter having an input terminal connected to said start-up circuit for receiving said start-up signal and having an output terminal coupled to said memory cell matrix;

a first switch having a control terminal connected to said output terminal of said first inverter, having a first current terminal connected to said second voltage source and having a second current terminal;

a second switch having a first current terminal connected to said second current terminal of said first switch, having a second current terminal connected to an internal memory voltage node of said memory cell matrix, and having a control terminal connected to the output terminal of said second inverter, said first switch and said second switch together being responsive to said start-up signal to connect said second voltage source to said memory cell matrix when the voltage level of said first voltage source falls to said threshold voltage level; and a third switch having a control terminal connected to said start-up circuit for receiving said start-up signal, having a first current terminal connected to said first voltage source and having a second current terminal connected to said internal memory voltage node, and being responsive to said start-up signal to connect said first voltage source to said memory cell matrix when the voltage level of said first voltage source is greater than said threshold voltage level.

12. The circuit of claim 11 wherein:

said first switch comprises a first P-channel transistor having a source connected to said second voltage source, a gate connected to said output terminal of said first inverter, and a drain;

said second switch comprises a second P-channel transistor having a source connected to said drain of said first P-channel transistor, a drain connected to said internal memory voltage node, and a gate connected to said output terminal of said second inverter; and said third switch comprises a third P-channel transistor having a source connected to said first voltage source, a drain connected to said internal memory voltage node, and a gate connected to said start-up circuit.

13. The circuit of claim 11 wherein said second inverter is responsive to said start-up signal by driving an enable signal to said memory cell matrix to permit read and write operations when said first voltage source is connected to said memory cell matrix.

14. The circuit of claim 10 wherein said start-up circuit comprises an odd number of inverters for providing said start-up signal.

15. The circuit of claim 10 wherein said voltage sensor comprises:

a differential amplifier configured to sense and to respond to said first and said second voltage levels, by producing a sense signal which permits said switching circuit to connect said first voltage source to said memory cell matrix when the voltage level of said first voltage source is greater than said threshold voltage level and which permits said switching circuit to connect said second voltage source to said memory cell matrix when the voltage level of said first voltage source falls to said threshold voltage level.

16. A non-volatile integrated circuit memory device comprising:

a package configured to receive a first voltage level from a first voltage source, and supporting:

a second voltage source for providing a second voltage level; and an integrated circuit chip including, a memory cell matrix disposed for storing data; and a sense-and-switch circuit coupled to said first voltage source, said second voltage source and said memory cell matrix, and responsive to said first voltage level by driving said first voltage level to said memory cell matrix when said first voltage level is above a predetermined threshold voltage level and driving said second voltage level to said memory cell matrix when said first voltage level falls to said threshold voltage level.

17. The integrated circuit device of claim 16 wherein: said second voltage source is disposed within said package.

18. The integrated circuit device of claim 16 wherein: said package has an outer surface on which said second voltage source is disposed.

19. The integrated circuit device of claim 16 wherein said second voltage source is a lithium source.

20. The integrated circuit device of claim 16 wherein said second voltage source is connect ed to said sense-and-switch circuit after chip fabrication so that damage to and drainage of said second voltage source is prevented.

21. The integrated circuit device of claim 16 wherein said sense-and-switch circuit comprises:

a voltage sensor responsive to said first voltage level and to said second voltage level by producing a sense signal;

a start-up circuit, connected to receive said sense signal, for inverting and delaying said sense signal to provide a start-up signal; and a switching circuit connected between said start-up circuit and said memory cell matrix, and responsive to said start-up signal by connecting said first voltage source to said memory cell matrix when said first voltage level is above said threshold voltage level and by connecting said second voltage source to said memory cell matrix when said first voltage level falls to said threshold voltage level.

22. The integrated circuit device of claim 21 wherein said voltage sensor comprises:

a differential amplifier configured to sense and to respond to said first and second voltage levels, by producing a sense signal which permits said switching circuit to connect said first voltage source to said memory cell matrix when the voltage level of said first voltage source is greater than said threshold voltage level and which permits said switching circuit to connect said second voltage source to said memory cell matrix when the voltage level of said first voltage source falls to said threshold voltage level.

23. The integrated circuit device of claim 21 wherein said switching circuit comprises:

a first inverter having an input terminal connected to said start-up circuit for receiving said start-up signal land having an output terminal;

a second inverter having an input terminal connected to said start-up circuit for receiving said start-up signal and having an output terminal coupled to said memory cell matrix;

a first switch having a control terminal connected to said output terminal of said first inverter, having a first current terminal connected to said second voltage source and having a second current terminal;

a second switch having a first current terminal connected to said second current terminal of said first switch, having a second current terminal connected to an internal memory voltage node of said memory cell matrix, and having a control terminal connected to said output terminal of said second inverter, said first switch and said second switch together being responsive to said start-up signal to connect said second voltage source to said memory cell matrix when the voltage level of said first voltage source falls to said threshold voltage level; and a third switch having a control terminal connected to said start-up circuit for receiving said start-up signal, having a first current terminal connected to said first voltage source, having a second current terminal connected to said internal memory voltage node, and being responsive to said start-up signal to connect said first source to said memory cell matrix when the voltage level of said first voltage source is greater than said threshold voltage level.

24. The integrated circuit device of claim 23 wherein:

said first switch comprises a first P-channel transistor having a source connected to said second voltage source, a gate connected to said output terminal of said first inverter, and a drain;

said second switch comprises a second P-channel transistor having a source connected to said drain of said first P-channel transistor, a drain connected to said internal memory voltage node, and a gate connected to said output terminal of said second inverter; and said third switch comprises a third P-channel transistor having a source connected to said first voltage source, a drain connected to said internal memory voltage node, and a gate connected to said start-up circuit.

25. The integrated circuit device of claim 23 wherein said second inverter is responsive to said start-up signal by driving an enable signal to said memory cell matrix to permit read and write operations when said first voltage source is connected to said memory cell matrix.

26. The integrated circuit device of claim 21 wherein said start-up circuit comprises an odd number of inverters.

27. A circuit for connecting a memory cell matrix to voltage sources to sustain data stored in the memory cell matrix, comprising:

first means for pulling up the voltage level of a first node;

second means for pulling up the voltage level of a second node;

third means coupled to said first node and to said second node for pulling the voltage level of said memory cell matrix up to the voltage level of said first node to permit read and write operations to said memory cell matrix; and fourth means coupled to said third means for maintaining the voltage level of said memory cell matrix at the voltage level of said second node to sustain data stored in said memory cell matrix if the voltage level of said first node falls to a predetermined threshold voltage level.

28. The circuit of claim 27 further comprising:

fifth means coupled to said fourth means for pulling the voltage level of said memory cell matrix up to the voltage level of said first node if the voltage level of said first node rises above said threshold voltage level.

29. A circuit for connecting a memory cell matrix to voltage sources to sustain data stored in the memory cell matrix, comprising:

first means for pulling up the voltage level of a first node;

second means for pulling up the voltage level of a second node; and third means coupled to said first and second means for driving the voltage level of said first node to said memory cell matrix if the voltage level of said first node is above a predetermined threshold voltage level and for driving the voltage level of said second node to said memory cell matrix if the voltage level of said first node falls to said threshold voltage level.

30. The circuit of claim 29 further comprising:

means for sensing the voltage levels of said first node and of said second node to provide an output signal for driving the voltage level of said first node to said memory cell matrix if the voltage level of said first node is above said threshold voltage level and for driving the voltage level of said second node to said memory cell matrix if the voltage level of said first node falls to said threshold voltage level.

31. A circuit for connecting a memory cell matrix to voltage sources, comprising:

a memory cell matrix for storing data;

a first voltage source for providing a first voltage level;

a second voltage source for providing a second voltage level;

a voltage sensor coupled to said first voltage source and to said second voltage source and responsive thereto by providing a sense signal;

a start-up circuit connected to said voltage sensor for receiving said sense signal, and inverting and delaying said sense signal to provide a start-up signal; and a switching circuit connected between said start-up circuit and said memory cell matrix, and responsive to said start-up signal by connecting said first voltage source to said memory cell matrix when said first voltage level is above a predetermined threshold voltage level and by connecting said second voltage source to said memory cell matrix when said first voltage level falls to said threshold voltage level.

32. A circuit for connecting a memory cell matrix to voltage sources, comprising:

a memory cell matrix for storing data;

a first voltage source for providing a first voltage level;

a second voltage source for providing a second voltage level;

a differential amplifier responsive to said first voltage level and to said second voltage level by producing a sense signal;

a start-up circuit connected to said differential amplifier and responsive to said sense signal by inverting and delaying said sense signal to provide a start-up signal;

a first inverter having an input connected to said start-up circuit for receiving said start-up signal and having an output;

a second inverter having an input connected to said start-up circuit for receiving said start-up signal and having an output coupled to said memory cell matrix;

a first switch connected to said output of said first inverter and to said second voltage source;

a second switch connected to said first switch, to an internal memory voltage node of said memory cell matrix, and to the output of said second inverter, said first switch and said second switch together being responsive to said start-up signal to connect said second voltage source to said memory cell matrix when the voltage level of said first voltage source falls to said threshold voltage level; and a third switch connected to said start-up circuit for receiving said start-up signal, to said first voltage source, and to said internal memory voltage node, and being responsive to said start-up signal to connect said first voltage source to said memory cell matrix when the voltage level of said first voltage source is greater than said threshold voltage level.

33. A method of connecting a memory cell matrix to voltage sources to sustain data stored in the memory cell matrix, comprising the steps of:

(a) providing a first voltage source and a second voltage source with voltage levels appropriate to sustain data in said matrix;

(b) pulling the voltage level of said memory cell matrix up to the voltage level of said first voltage source to permit read and write operations to said memory cell matrix; and (c) if the voltage level of the first voltage source falls to a predetermined threshold voltage level, then maintaining the voltage level of said memory cell matrix at the voltage level of said second voltage source to sustain data stored in said memory cell matrix.

34. The method of claim 33 further comprising after step (c) the step of:

pulling the voltage level of said memory cell matrix up to the voltage level of said first voltage source if the voltage level of said first voltage source rises above said threshold voltage level.

35. A method of connecting a memory cell matrix to voltage sources to sustain data stored in the memory cell matrix, comprising the steps of:

(a) providing a first voltage source and a second voltage source with voltage levels appropriate to sustain data in said matrix; and (b) connecting said first voltage source to said memory cell matrix if the voltage level of said first voltage source is above a predetermined threshold voltage level, and if the voltage level of said first voltage source falls to said threshold voltage level then connecting said second voltage source to said memory cell matrix.

36. The method of claim 35 further comprising, before step (b) the step of: sensing the voltage levels of said first voltage source and of said second voltage source to provide an output signal:

for connecting said memory cell matrix to said first voltage source if the voltage level of said first voltage source is above said threshold voltage level, and for connecting said memory cell matrix to said second voltage source if the voltage level of said first voltage source is not above said threshold voltage level.

37. A method of connecting a memory cell matrix in an integrated circuit chip to voltage sources to sustain data stored in the memory cell matrix, comprising the steps of:

(a) providing a first voltage source external to said integrated circuit chip and having a voltage level;

(b) providing a second voltage source having a voltage level appropriate to sustain data in said matrix; and (c) connecting said first voltage source to said memory cell matrix if the voltage level of said first voltage source is above a predetermined threshold voltage level, and connecting said second voltage source to said memory cell matrix if the voltage level of said first voltage source falls to said threshold voltage level.

38. The method of claim 37 further comprising, before step (c) the step of:

sensing the voltage levels of said first voltage source and of said second voltage source to provide an output signal for connecting said memory cell matrix to said first voltage source if the voltage level of said first voltage source is above said threshold voltage level, and for connecting said memory cell matrix to said second voltage source if the voltage level of said first voltage source falls to said threshold voltage level.

39. The method of claim 37 wherein said second voltage source is disposed inside a package with said integrated circuit chip.

40. The method of claim 37 wherein said second voltage source is disposed on the outside surface of a package containing said integrated circuit chip.

41. A method of connecting a memory cell matrix to voltage sources to sustain data stored in the memory cell matrix, comprising the steps of:

(a) pulling up the voltage levels of a first node and of a second node;

(b) pulling the voltage level of said memory cell matrix up to the voltage level of said first node to permit read and write operations to said memory cell matrix; and (c) maintaining the voltage level of said memory cell matrix at the voltage level of said second node to sustain data stored in said memory cell matrix if the voltage level of said first node falls to a predetermined threshold voltage level.

42. The method of claim 41 further comprising the step of:

pulling the voltage level of said memory cell matrix up to the voltage level of said first node if the voltage level of said first node rises above said threshold voltage level.

43. A method of connecting a memory cell matrix to voltage sources to sustain data stored in the memory cell matrix, comprising the steps of:

(a) pulling up the voltage levels of a first node and of a second node; and (b) driving the voltage level of said first node to said memory cell matrix if the voltage level of said first node is above a predetermined threshold voltage level and driving the voltage level of said second node to said memory cell matrix if the voltage level of said first node falls to said threshold voltage level.

44. The method of claim 43 further comprising the step of:

sensing the voltage levels of said first node and of said second node to provide an output signal for driving the voltage level of said first node to said memory cell matrix if the voltage level of said first node is above said threshold voltage level and driving the voltage level of said second node to said memory cell matrix if the voltage level of said first node falls to said threshold voltage level.

* * * * *